(12) United States Patent
Taguchi

(10) Patent No.: US 10,483,666 B2
(45) Date of Patent: Nov. 19, 2019

(54) SOCKET RECEIVING AN ELECTRONIC COMPONENT HAVING A PLURALITY OF CONTACT PADS

(71) Applicant: Tyco Electronics Japan G.K., Kanagawa (JP)

(72) Inventor: Hidenori Taguchi, Kanagawa (JP)

(73) Assignee: Tyco Electronics Japan G.K., Kanagawa (JP)

( * ) Notice: Subject to any disclaimer, the term of this patent is extended or adjusted under 35 U.S.C. 154(b) by 0 days.

(21) Appl. No.: 15/939,380

(22) Filed: Mar. 29, 2018

(65) Prior Publication Data

US 2018/0287279 A1 Oct. 4, 2018

(30) Foreign Application Priority Data

Mar. 31, 2017 (JP) .................................. 2017-069445

(51) Int. Cl.

| H01R 12/70 | (2011.01) |
|---|---|
| H01R 13/24 | (2006.01) |
| H01R 13/405 | (2006.01) |
| H01R 12/71 | (2011.01) |
| H05K 7/10 | (2006.01) |

(Continued)

(52) U.S. Cl.
CPC ....... *H01R 12/7076* (2013.01); *H01R 12/714* (2013.01); *H01R 13/24* (2013.01); *H01R 13/2442* (2013.01); *H01R 13/405* (2013.01); *H05K 7/1038* (2013.01); *H01R 4/028* (2013.01); *H01R 12/58* (2013.01)

(58) Field of Classification Search
CPC .. H01R 12/7076; H01R 12/714; H01R 13/24; H01R 13/405; H01R 13/2442; H01R 4/028; H01R 12/58; H05K 7/1038
USPC ................ 439/626, 65, 66, 84, 91, 873, 943
See application file for complete search history.

(56) References Cited

U.S. PATENT DOCUMENTS

| 3,660,726 A * | 5/1972 | Ammon | ................. H01R 12/58 174/262 |
|---|---|---|---|
| 7,753,695 B2 * | 7/2010 | Howell | ................. H01R 13/33 439/66 |

(Continued)

FOREIGN PATENT DOCUMENTS

| JP | 660067 U | 8/1994 |
|---|---|---|
| JP | 2003187917 A | 7/2003 |

(Continued)

*Primary Examiner* — Travis S Chambers
(74) *Attorney, Agent, or Firm* — Barley Snyder

(57) ABSTRACT

A socket comprises a housing made of an insulating board and a plurality of contacts arranged on a first surface of the housing. The housing has a plurality of passageways each extending through the housing and having an inner wall surface plated with a conductive material. The housing also has a conductive pad formed on the first surface of the housing that is electrically continuous with the conductive material of the inner wall surface. Each of the contacts includes a contact portion positioned above the first surface of the housing and configured to be elastically deformed by a contact pad electrically connected with the contact, an insertion portion inserted into one of the passageways and configured to be elastically deformed and pressed by the inner wall surface of the passageway, and a joint portion joined to the conductive pad.

12 Claims, 6 Drawing Sheets

(51) Int. Cl.
 *H01R 4/02* (2006.01)
 *H01R 12/58* (2011.01)

(56) References Cited

U.S. PATENT DOCUMENTS

| | | | |
|---|---|---|---|
| 7,950,932 B2* | 5/2011 | Fan | H01R 13/2464 |
| | | | 439/82 |
| 8,172,615 B2* | 5/2012 | Mason | H01R 12/714 |
| | | | 439/108 |
| 8,770,987 B2* | 7/2014 | Horikawa | H01R 12/716 |
| | | | 439/71 |
| 9,039,448 B2* | 5/2015 | Mason | H01R 13/65807 |
| | | | 439/607.09 |
| 9,604,300 B2* | 3/2017 | Ju | B23K 1/0056 |
| 2004/0094328 A1* | 5/2004 | Fjelstad | H01R 9/0515 |
| | | | 174/251 |
| 2008/0207011 A1* | 8/2008 | Goosens | H01R 29/00 |
| | | | 439/61 |
| 2015/0270661 A1* | 9/2015 | Kao | H01R 13/5202 |
| | | | 439/271 |

FOREIGN PATENT DOCUMENTS

| | | |
|---|---|---|
| JP | 2004319630 A | 11/2004 |
| JP | 200816343 A | 1/2008 |
| JP | 20134175 A | 1/2013 |

* cited by examiner

SOCKET RECEIVING AN ELECTRONIC COMPONENT HAVING A PLURALITY OF CONTACT PADS

CROSS-REFERENCE TO RELATED APPLICATION

This application claims the benefit of the filing date under 35 U.S.C. § 119(a)-(d) of Japanese Patent Application No. 2017-069445, filed on Mar. 31, 2017.

FIELD OF THE INVENTION

The present invention relates to a socket and, more particularly, to a socket receiving an electronic component having a plurality of contact pads.

BACKGROUND

To electrically connect to a circuit board, large-scale electronic components are commonly mounted in a socket soldered to the circuit board instead of being directly soldered to the circuit board. The socket has multiple contacts in a socket housing which contact contact pads arranged on a bottom surface of the electronic component.

A liquid crystal polymer (LCP) resin is often used for the socket housing. The LCP resin, however, has a coefficient of thermal expansion different from that of the circuit board. In modern applications, a large-scale CPU may have as many as three thousand contact pads two-dimensionally arranged with a pitch of 1 mm on the bottom surface. If the housing of the socket for such a large-scale electronic component is made of the LCP resin, the difference in coefficient of thermal expansion between the LCP resin and the circuit board may cause a soldering portion to crack or may cause the socket to warp when the socket returns to ordinary temperature after being soldered to the circuit board.

Accordingly, using the same material as the circuit board for the housing of the socket is contemplated for avoid warping for large-scale electronic components. In the housing of the socket, through-holes having inner wall surfaces plated with a conductive material are formed in order to electrically connect top and bottom surfaces of the housing. The passageways are circular holes. The contacts of the socket, however, are stamped or otherwise formed from a sheet metal. In the context of the above example, it is difficult to precisely and immovably place as many as three thousand of these contacts with a pitch of 1 mm to precisely connect with the through-holes.

Japanese Patent Application No. 2004-319630 discloses a board module in which two inserting ends of a lead terminal are inserted into respective passageways formed in a board and the inserted ends are soldered thereto. In the case of JP 2004-319630, however, a difference in dimensions or the like between the inserting ends and the passageways makes it difficult to precisely control the position of the lead terminal.

SUMMARY

A socket comprises a housing made of an insulating board and a plurality of contacts arranged on a first surface of the housing. The housing has a plurality of passageways each extending through the housing and having an inner wall surface plated with a conductive material. The housing also has a conductive pad formed on the first surface of the housing that is electrically continuous with the conductive material of the inner wall surface. Each of the contacts includes a contact portion positioned above the first surface of the housing and configured to be elastically deformed by a contact pad electrically connected with the contact, an insertion portion inserted into one of the passageways and configured to be elastically deformed and pressed by the inner wall surface of the passageway, and a joint portion joined to the conductive pad.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
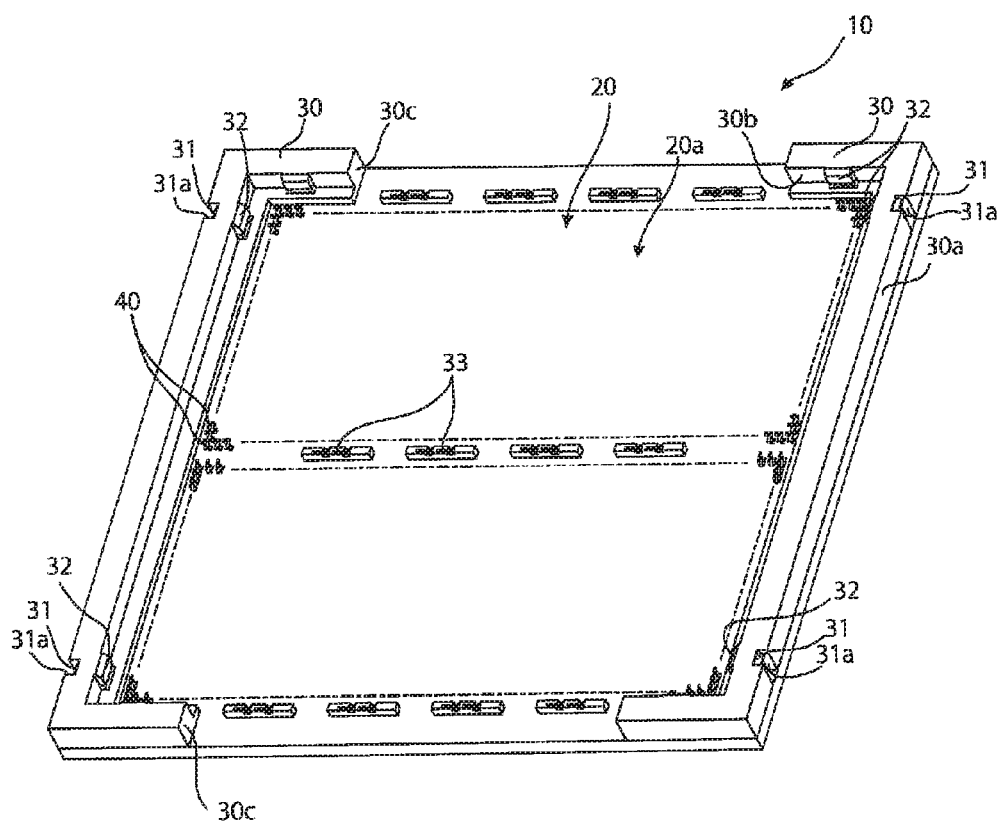
FIG. 1 is a perspective view of a socket according to an embodiment.

Embodiments of the present invention will be described hereinafter in detail with reference to the attached drawings, wherein like reference numerals refer to the like elements. The present invention may, however, be embodied in many different forms and should not be construed as being limited to the embodiments set forth herein; rather, these embodiments are provided so that the disclosure will be thorough and complete and will fully convey the concept of the invention to those skilled in the art.

A socket 10 according to an embodiment, shown in FIG. 1, has a housing 20 made of an insulating board and a frame 30 fixed to the housing 20 for positioning an electronic component to be mounted. The housing 20 is made of a same material as a circuit board (not shown) to which the socket 10 is to be soldered. The electronic component may be a large-scale CPU (not shown) configured to be mounted to the socket 10 shown in FIG. 1. As many as three thousand contact pads are two-dimensionally arranged on a bottom surface of the CPU with a pitch of 1 mm along both the length and width (1-mm grid). The array of the contact pads may be a 1.5-mm staggered array, a 0.9-mm helix, or the like. The socket 10 shown in FIG. 1 is described herein as mounting a CPU, however, the socket 10 of the present invention is applicable not only to a CPU but also to electronic components in general of a type having contact pads arranged on the bottom surface.

Multiple contacts 40 are also fixed to the housing 20; for the sake of simplicity of illustration, only a few of the multiple contacts 40 are depicted in FIG. 1. A total of three thousand contacts 40 are two-dimensionally arranged with a pitch of 1 mm in a region enclosed by dot-and-dash lines in FIG. 1 so as to correspond to the array of the contact pads on the bottom surface of the CPU to be mounted.

As shown in FIG. 1, recesses 31a are formed in an outer wall surface 30a of the frame 30, and a protrusion 31 is provided in each recess 31a. The protrusion 31 is a protrusion for catching a cap (not shown) for protecting the contacts 40 of the socket 10 not yet used. On an inner wall surface 30b of the frame 30, protrusions 32 are provided. The protrusion 32 is a protrusion for positioning the CPU mounted to the socket 10. The frame 30 is formed with cutouts 30c. The cutout 30c is a cutout for permitting a user to pinch the CPU when the CPU mounted to the socket 10 is removed therefrom. A plurality of supporting mounts 33 are provided on a first surface 20a of the housing 20; the supporting mounts 33 are mounts for seating the CPU mounted to the socket 10.

Figure 2A:
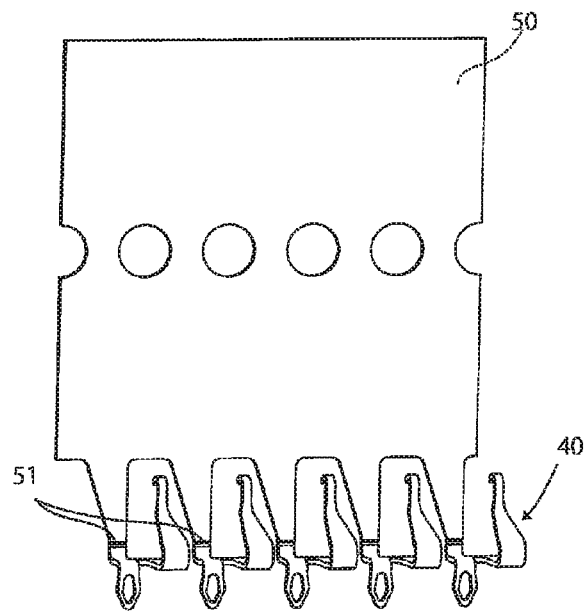
FIG. 2A is a perspective view of a plurality of contacts with a carrier.
Figure 2B:
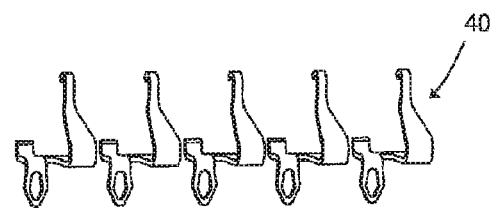
FIG. 2B is a perspective view of the contact separated from the carrier.

The contacts 40 are shown connected to a carrier 50 in FIG. 2A and are shown separated from the carrier 50 in FIG. 2B. Multiple (three thousand in total) passageways two-dimensionally arranged with a pitch of 1 mm (1-mm grid) are formed in the housing 20 of the socket 10. The same number of contacts 40 as the passageways in one line are inserted into the passageways without being separated from a carrier 50. Thereafter, each of the contacts 40 is soldered to the housing 20. The carrier 50 is bent at notches 51 and removed except for the contacts 40, as shown in FIG. 2B.

The housing 20, as shown in FIGS. 3A-4B, is made of an insulating board and formed with a passageway 21. The passageway 21 extends completely through the housing 20 from a first surface 20a to an opposite second surface 20b of the housing 20. An inner wall surface 21a of the passageway 21 is plated with a conductive material. In the entire housing 20, the same number of passageways 21 as the multiple contacts 40 are two-dimensionally arranged with a pitch of 1 mm (1-mm grid) in the housing 20.

Figure 3A:
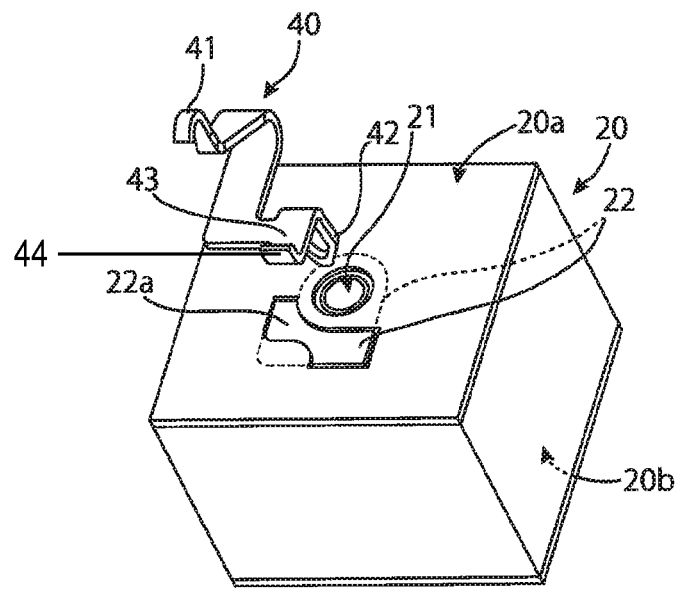
FIG. 3A is a perspective view of a portion of a housing of the socket with a contact before insertion of the contact.
Figure 3B:
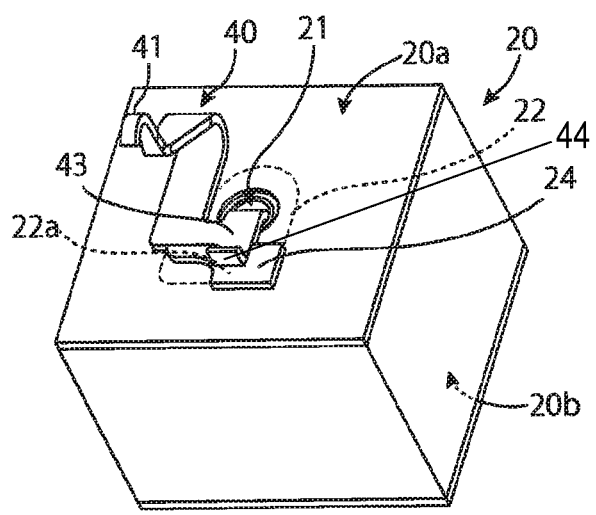
FIG. 3B is a perspective view of the portion of the housing with the contact after insertion of the contact.
Figure 4A:
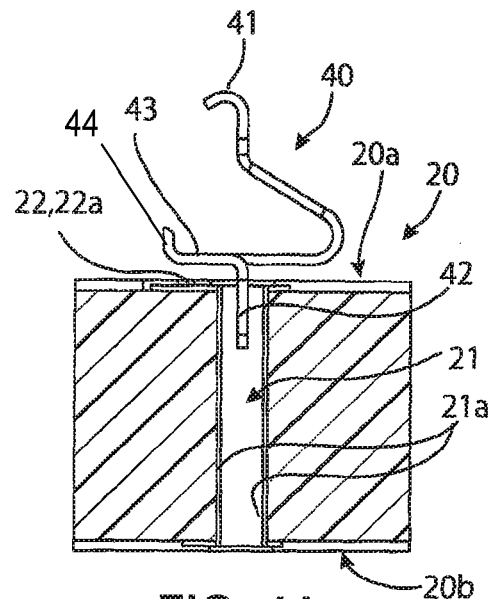
FIG. 4A is a sectional view of the portion of the housing with the contact before insertion of the contact.
Figure 4B:
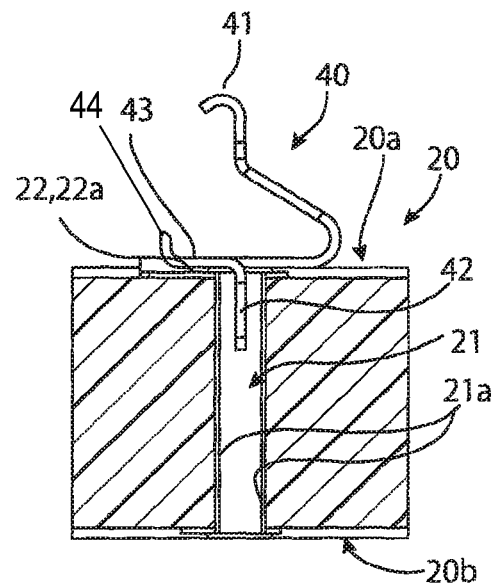
FIG. 4B is a sectional view of the portion of the housing with the contact after insertion of the contact.

As shown in FIGS. 3A and 3B, a conductive pad 22 extending from the passageway 21 is formed on the first surface 20a of the housing 20. The conductive pad 22 is formed so as to correspond to the passageway 21 and is electrically continuous with the conductive material with which the inner wall surface 21a of the corresponding passageway 21 is plated. The conductive pad 22 spreads over a region shown by a dot line in FIGS. 3A and 3B. The region enclosed by the conductive pad 22 is covered with a solder resist. The contact 40 is soldered to a region of the conductive pad 22 that is not covered with the solder resist and is separated from the passageway 21; the region separated from the passageway 21 and not covered with the solder resist is referred to as soldering region 22a. The conductive pad 22 may be referred to hereinafter as a first conductive pad and the soldering region 22a may be referred to hereinafter as a first soldering region.

The contact 40 is produced by stamping and bending of a sheet metal material having elasticity. The contact 40 is produced such that the multiple contacts 40 are connected to the carrier 50, as shown in FIG. 2A, and the contact 40 kept connected to the carrier 50 is disposed on the first surface 20a of the housing 20. The contact 40 is separated from the carrier 50 after the contact 40 is soldered to the housing 20.

The contact 40, as shown in FIGS. 3A-4B, has a contact portion 41, a press-fit portion 42, a solder-joint portion 43, and a raised portion 44. The contact 40 may be referred to hereinafter as a first contact. In addition, the contact portion 41, the press-fit portion 42, the solder-joint portion 43, and the raised portion 44 correspond to a first contact portion, a first insertion portion, a first solder-joint portion, and a first raised portion. The contact portion 41 is elastically deformed by being pressed by the contact pad on the bottom surface of the CPU mounted to the socket 10 and establishes electrical contact with the contact pad. The press-fit portion 42 is inserted into the passageway 21 and has an eye-of-needle shape. The width of the press-fit portion 42 is slightly wider than the inner diameter of the passageway 21, accordingly, the press-fit portion 42 is press-fitted into the passageway 21 and is elastically deformed by being pressed by the inner wall surface 21a of the passageway 21.

Since the contact 40 has the press-fit portion 42 press-fitted into the passageway 21, the position and/or attitude of the contact 40 is temporarily fixed. However, if the contact 40 is left as it is, the position or attitude of the contact 40 may change. The solder-joint portion 43 is soldered to the soldering region 22a of the conductive pad 22 after the press-fit portion 42 is press-fitted into the passageway 21. Thereafter, as described above, by bending and breaking the carrier 50, each of the contacts 40 is separated from the carrier 50 so that each of the contacts 40 becomes an independent piece. Though described as a solder-joint portion 43, the joint portion may be another joint portion, such as a laser-beam-welding joint portion, adhesion using conductive resin, ultrasonic welding, pressure welding, or the like.

The raised portion 44, as shown in FIGS. 3A-5B and 6A-6C, extends from the first joint portion 43 in a direction perpendicular to the first joint portion 43. The raised portion 44 is disposed on a side of the first joint portion 43 opposite the first contact portion 41. The raised portion 44 is offset from the first contact portion 41 in a direction extending along a length of the first joint portion 43.

The soldering region 22a of the conductive pad 22 is a region separated from the passageway 21 as shown in FIGS. 3A-4B. Accordingly, a solder 24 on the soldering region 22a is reliably prevented from flowing into the passageway 21 when the solder 24 is melted for soldering the contact 40. A region of the conductive pad 22 between the soldering region 22a and the passageway 21 is further covered with the solder resist in an embodiment and, accordingly, the solder in the soldering region 22a is further reliably prevented from flowing into the passageway 21 when the solder on the soldering region 22a is melted.

The conductive pad 22 including the soldering region 22a is electrically continuous with the conductive material of the inner wall surface 21a of the passageway 21. Soldering ensures that the contact 40 establishes electrical continuity with the second surface 20b of the housing 20 via the conductive pad 22 and the conductive material of the inner wall surface 21a of the passageway 21. Accordingly, the press-fit portion 42 is not required to ensure electrical continuity with the conductive material of the inner wall surface 21a of the passageway 21; the press-fit portion 42 is designed to be inserted with a pressure suitable for temporarily retaining the contact 40 until the contact 40 is soldered.

The second surface 20b of the housing 20 will now be described with reference to FIGS. 5A-5C.

Figure 5A:
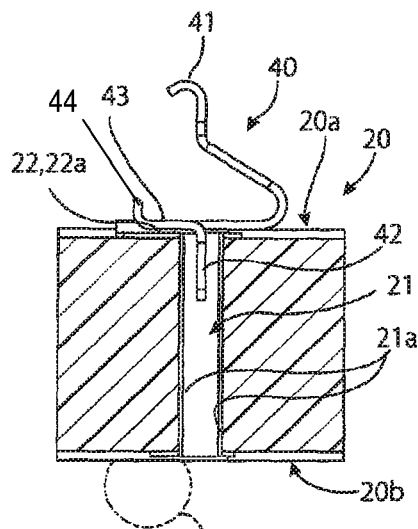
FIG. 5A is a sectional view of the portion of the housing with a solder ball and the contact after insertion of the contact.
Figure 5B:
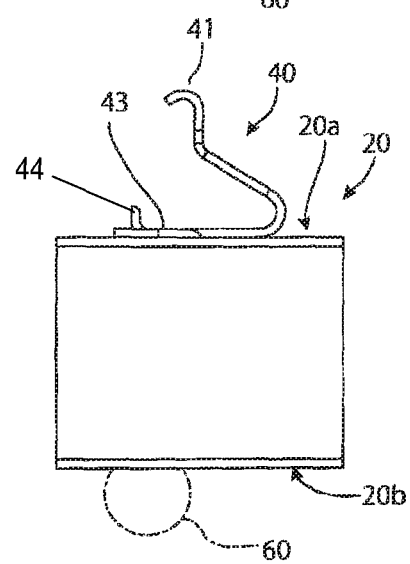
FIG. 5B is a side view of the portion of the housing with the solder ball and the contact after insertion of the contact.
Figure 5C:
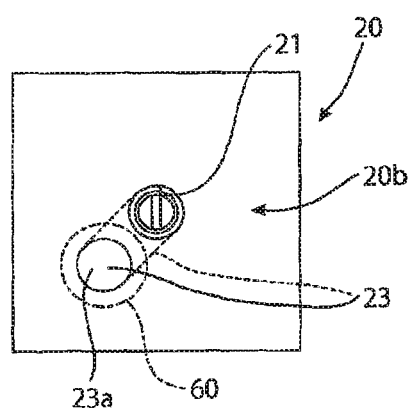
FIG. 5C is a bottom view of the portion of the housing with the solder ball and the contact after insertion of the contact.

A solder ball 60 is attached to the second surface 20b of the housing 20 as shown in FIGS. 5A-5C. Over the entire housing 20, the solder balls 60 are two-dimensionally arranged with the same pitch as the array pitch of the contacts 40.

Also on the second surface 20b of the housing 20, as shown in FIG. 5C, a conductive pad 23 spreading from the passageway 21 is formed, as in the case of the first surface 20a. The conductive pad 23 is also formed, as in the case of the conductive pad 22 on the first surface 20a side, such that multiple conductive pads 23 correspond to the respective passageways 21. The conductive pad 23 is continuous with the conductive material of the inner wall surface 21a of the corresponding passageway 21 and extends over a region dotted in FIG. 5C. The region dotted in FIG. 5C is covered with a solder resist.

The ball 60 is attached to a region of the conductive pad 23 that is not covered with the solder resist and is separated from the passageway 21. The region of the conductive pad 23 that is separated from the passageway 21 and not covered with the solder resist is a region at which the socket 10 is to be soldered to the circuit board; this region is here referred to as soldering region 23a. The solder ball 60 attached to the soldering region 23a is melted when the socket 10 is soldered to the circuit board. Since the melted solder from the solder ball 60 is located away from the passageway 21, the melted solder of the solder ball 60 is prevented from flowing into the passageway 21. The soldering region 23a of the conductive pad 23 and the passageway 21 are also separated by the solder resist and, accordingly, the melted solder is further reliably held in the soldering region 23a.

Figures 6A, 6B, 6C:
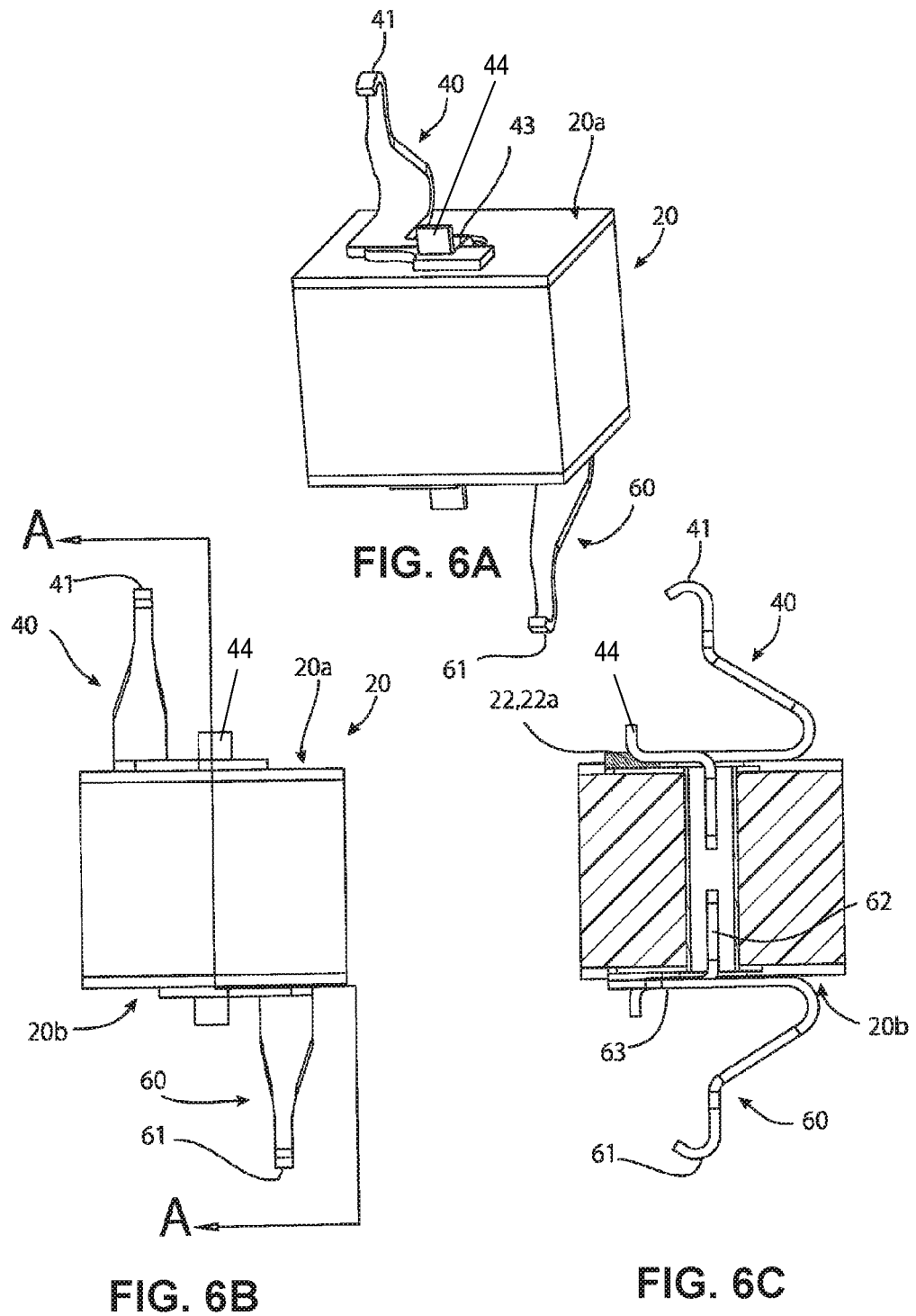
FIG. 6A is a perspective view of a housing with a plurality of contacts according to another embodiment.
FIG. 6B is a side view of the housing and the contacts of FIG. 6A.
FIG. 6C is a sectional view of the housing and the contacts of FIG. 6A.

A housing 20 with a contact 60 according to another embodiment is shown in FIGS. 6A-6C. One contact 60 is arranged on each of a first surface 20a and a second surface 20b of the housing 20. Like reference numerals refer to like elements and only the differences with respect to the embodiment shown in FIGS. 1-5C will be described in detail. In the embodiment shown in FIGS. 6A-6C, the structure on the first surface 20a side of the housing 20 is identical with the structure in the embodiment described above with reference to FIGS. 1-5C.

The structure on the second surface 20b side of the housing 20 in the second embodiment, however, unlike the embodiment described above, has contacts 60 arranged as to correspond to the passageways 21. Each of the contacts 60 has the same structure as each of the contacts 40 arranged on the first surface 20a side of the housing 20 and has a contact portion 61, a press-fit portion 62, and a solder-joint portion 63. Furthermore, the second surface 20b of the housing 20 has a conductive pad having the same structure as the conductive pad 22 formed on the first surface 20a, and the contact 60 is joined by soldering to a soldering portion of the conductive pad of the second surface 20b. The contact 60 arranged on the second surface 20b side of the housing 20 may be referred to as a second contact and the contact portion 61, the press-fit portion 62 and the solder-joint portion 63 may be referred to as a second contact portion, a second insertion portion, and a second solder-joint portion. The conductive pad and the soldering portion formed on the second surface 20b side may be referred to as a second conductive pad and a second soldering portion.

The socket of the embodiment shown in FIGS. 6A-6C has a similar structure on its upper surface side to the socket 10 and is to mount a CPU. The socket is also adapted to be mounted onto a circuit board. The socket of the embodiment shown in FIGS. 6A-6C is required to be positioned to the circuit board; the circuit board has a positioning hole and the socket has a positioning pin. The socket is positioned by inserting the positioning pin into the positioning hole. A load plate covering the CPU mounted to the socket is provided and the load plate is screwed or otherwise fixed to the circuit board.

The socket 10 is fixed by soldering to the circuit board and is difficult to remove from the circuit board. The socket of the embodiment of FIGS. 6A-6C is easily removed from the circuit board only by unscrewing or otherwise releasing the socket from the circuit board, so that maintenance and/or replacement can be performed.

What is claimed is:

1. A socket, comprising:
   (a) a housing made of an insulating board and having:
      (1) a plurality of passageways arranged over the housing, each of the passageways extending through the housing from a first surface of the housing to an opposite second surface of the housing and having an inner wall surface plated with a conductive material; and
      (2) a first conductive pad formed on the first surface of the housing so as to correspond to one of the passageways, the first conductive pad being electrically continuous with the conductive material of the inner wall surface of the passageway and extending from the passageway; and
   (b) a plurality of first contacts arranged on the first surface of the housing and each corresponding to one of the plurality of passageways, each of the first contacts includes:
      (1) a first contact portion positioned above the first surface of the housing and configured to be elastically deformed by a first contact pad electrically connected with the first contact;
      (2) a first insertion portion inserted into one of the passageways and configured to be elastically deformed and pressed by the inner wall surface of the passageway;
      (3) a first joint portion joined to the first conductive pad; and
      (4) a raised portion extending from the first joint portion in a direction perpendicular to the first joint portion, the raised portion is disposed on a side of the first joint portion opposite the first contact portion.

2. The socket of claim 1, wherein the raised portion is offset from the first contact portion in a direction extending along a length of the first joint portion.

3. The socket of claim 1, wherein the first joint portion is surface-mounted and soldered to the first conductive pad.

4. The socket of claim 3, wherein the first joint portion is soldered to a first soldering region of the first conductive pad spaced apart from the passageway.

5. The socket of claim 4, wherein a region of the first conductive pad between the first soldering region and the passageway is covered with a solder resist.

6. The socket of claim 1, wherein the housing has a second conductive pad formed on the second surface of the housing and corresponding with the passageway, the second conductive pad is electrically continuous with the conductive material of the inner wall surface of the passageway and extends from the passageway.

7. The socket of claim 6, wherein a plurality of second contacts are arranged on the second surface of the housing and each correspond to one of the plurality of passageways.

8. The socket of claim 7, wherein each of the second contacts includes:

(a) a second contact portion positioned above the second surface of the housing and configured to be elastically deformed by a second contact pad electrically connected with the second contact;
(b) a second insertion portion inserted into one of the passageways and configured to be elastically deformed and pressed by the inner wall surface of the passageway; and
(c) a second joint portion joined to the second conductive pad.

9. The socket of claim 8, wherein the first contact pad is a contact pad formed on an electrical component and the second contact pad is a contact pad formed on a circuit board.

10. The socket of claim 8, wherein the second joint portion is surface-mounted and soldered to the second conductive pad.

11. The socket of claim 10, wherein the second joint portion is soldered to a second soldering region of the second conductive pad spaced apart from the passageway.

12. The socket of claim 11, wherein a region of the second conductive pad between the second soldering region and the passageway is covered with a solder resist.

* * * * *